United States Patent [19]

McCarthy et al.

[11] 4,416,055

[45] Nov. 22, 1983

[54] METHOD OF FABRICATING A MONOLITHIC INTEGRATED CIRCUIT STRUCTURE

[75] Inventors: Jeremiah P. McCarthy, Framingham; Marvin Tabasky, Peabody, both of Mass.

[73] Assignee: GTE Laboratories Incorporated, Waltham, Mass.

[21] Appl. No.: 327,383

[22] Filed: Dec. 4, 1981

[51] Int. Cl.³ .................... H01L 21/31; H01L 21/318
[52] U.S. Cl. .................. 29/577 C; 29/576 B; 29/576 E; 29/576 W; 29/578; 148/1.5; 148/175; 148/187; 357/20; 357/40; 357/48; 357/91
[58] Field of Search ............ 29/576 B, 576 E, 576 W, 29/577 C, 578; 148/175, 187, 1.5; 357/20, 40, 34, 48, 51, 91

[56] References Cited

U.S. PATENT DOCUMENTS

| | | | |
|---|---|---|---|
| 3,717,507 | 2/1973 | Abe | 148/1.5 |
| 3,885,999 | 5/1975 | Fusaroli et al. | 148/175 |
| 3,918,997 | 11/1975 | Mohsen et al. | 148/1.5 |
| 3,959,040 | 5/1976 | Robertson | 148/187 X |
| 4,021,270 | 5/1977 | Hunt et al. | 148/1.5 |
| 4,231,819 | 11/1980 | Raffel et al. | 29/576 W X |

OTHER PUBLICATIONS

Yau et al., "Fabrication of a Low-Noise . . . Bipolar Transistor . . . " IEEE Trans. on Electron Dev., vol. ED-25, No. 4, Apr. 1978, pp. 413-419.
Archer, J. R., "Low-Noise Implanted-Base Microwave Transistors" Solid-State Electronics, vol. 17, 1974, pp. 387-393.

Primary Examiner—W. G. Saba
Attorney, Agent, or Firm—David M. Keay

[57] ABSTRACT

Method of fabricating monolithic integrated circuit structure incorporating a bipolar transistor and a high value resistor. First and second N-type sectors are formed in an N-type epitaxial layer by junction isolation. A silicon oxide layer is formed on the surface of the body. The layer is thinner over a part of the first sector and over a part of the second sector. A layer of silicon nitride is formed on portions of the thinner silicon oxide to overlie predetermined zones within each sector. P-type conductivity imparting material is ion implanted through the unprotected thinner silicon oxide to form a low resistivity region in the first sector and two low resistivity regions in the second sector. The layer of silicon nitride overlying the predetermined zone in the second sector is removed, and an opening is formed over the predetermined zone in the second sector. P-type conductivity imparting material is ion implanted through the opening to form a resistor in the predetermined zone of the second sector with the two low resistivity regions providing contact regions at opposite ends thereof. The thickness of the silicon oxide layer is increased except over the predetermined zone of the first sector where it is protected by the remaining silicon nitride layer. The silicon nitride and the underlying silicon oxide are removed exposing the predetermined zone in the first sector. N-type and P-type conductivity imparting materials are ion implanted in the predetermined zone to complete the structure.

16 Claims, 10 Drawing Figures

METHOD OF FABRICATING A MONOLITHIC INTEGRATED CIRCUIT STRUCTURE

BACKGROUND OF THE INVENTION

This invention relates to monolithic integrated circuit structures. More particularly, it is concerned with methods of fabricating bipolar transistors and resistors in monolithic integrated circuit structures.

Frequently there is a requirement for high frequency, low noise bipolar transistors in monolithic integrated circuit structure. In addition, the circuitry may require resistors having carefully controlled characteristics. Previously it has been difficult to obtain the desired control of critical emitter and base dimensions and resistivity profiles. Problems were also encountered in fabricating resistors, particularly high value resistors. Typically, resistors were formed simultaneously with the formation of the transistor base regions. Thus, the resistor dimensions were based upon the resistivity profile of the transistor base regions. Limitations in the precision obtainable with the photolithographic techniques employed in establishing the dimensions of the elements placed additional constraints on the ability to control device characteristics.

SUMMARY OF THE INVENTION

High frequency, low noise bipolar transistors with good current gain and cut-off frequency characteristics together with resistors the characteristics of which are determined independently of the transistor characteristics are obtained by the method of the present invention. The method of fabricating monolithic integrated circuit structure incorporating a bipolar transistor and a resistor in accordance with the present invention comprises providing a body of semiconductor material which includes a first section having semiconductor material of one conductivity type, for example P-type, encircling a first sector of the opposite conductivity, for example N-type, inset at a surface of the body and a second section having semiconductor material of the one conductivity type encircling a second sector of the opposite conductivity type inset at the surface of the body. An adherent layer of a first protective material, for example silicon oxide, is formed on the surface of the body. The portion of the layer overlying a predetermined part of the first sector is made thinner than the portion of the layer overlying the remainder of the first section. Similarly, the portion of the layer overlying a predetermined part of the second sector is made thinner than the portion of the layer overlying the remainder of the second section. A layer of a second protective material, for example silicon nitride, is formed on the thinner portion of the layer of the first protective material overlying a predetermined zone within the part of the first sector, and an adherent layer of the second protective material is also formed on the thinner portion of the layer of the first protective material overlying a predetermined zone within the part of the second sector. Conductivity type imparting material of the one conductivity type is introduced into the part of the first sector other than the predetermined zone protected by the second protective material, the thicker portion of the layer of the first protective material protecting the remainder of the first section, so as to form a region of the one conductivity type of low resistivity within the first sector. Simultaneously conductivity type imparting material of the one conductivity type is introduced into the part of the second sector other than the predetermined zone protected by the second protective material, the thicker portion of the layer of the first protective material protecting the remainder of the second section, so as to form first and second regions of the one conductivity type of low resistivity within the second sector.

Next, the layer of the second protective material which overlies the predetermined zone of the part of the second sector is removed. Conductivity type imparting material of the one conductivity type is introduced into the predetermined zone of the part of the second sector so as to form a region of the one conductivity type of high resistivity extending between the first and second regions of the one conductivity type of low resistivity. The thickness of the layer of the first protective material is increased except for that portion which underlies the layer of the second protective material overlying the predetermined zone of the part of the first sector. The layer of the second protective material overlying the predetermined zone of the part of the first sector is then removed. The thickness of the layer of the first protective material is reduced sufficiently to form an opening in the layer of the first protective material thus exposing the surface of the predetermined zone while leaving a layer of the first protective material overlying the remainder of the first section and the second section. Conductivity type imparting material of the one conductivity type is introduced into a first portion and conductivity type imparting material of the opposite conductivity is introduced into a second portion of the predetermined zone as delineated by the opening. The second portion is located between the first portion and the surface of the body of semiconductor material.

The second portion of the predetermined zone provides the active emitter region, the first portion of the predetermined zone provides the active base region, the portion of the first sector of the opposite conductivity type which lies adjacent to the first portion of the predetermined zone provides the active collector region, and the region of one conductivity type of low resistivity provides a base contact region of a bipolar transistor located within the first section. The region of the one conductivity type of high resistivity provides a resistor, and the first and second regions of the one conductivity type of low resistivity provide resistor contact regions of a resistor within said second section.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

In fabricating a monolithic integrated circuit structure containing a bipolar transistor and a resistor in accordance with the invention as illustrated in the figures a substrate of single crystal semiconductor material of one conductivity type is provided as a supporting structure. As is well-understood the substrate is usually a slice or wafer of relatively large surface area upon which many identical circuit networks each including many devices are fabricated simultaneously. However, for purposes of illustration the fabrication of only a single bipolar transistor and a single resistor in a fragment of a slice will be shown and described. In the following description silicon is employed as the semiconductivity material and the substrate is of P-type conductivity.

Figure 1:
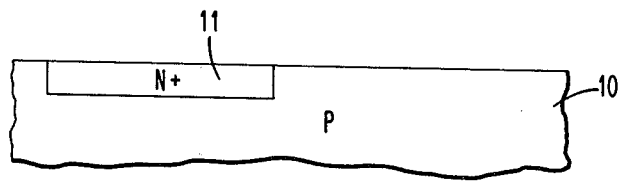
FIGS. 1 through 9 are a series of elevational view in cross-section of a fragment of a wafer of semiconductor material illustrating successive steps in the fabrication of a bipolar transistor and a resistor in accordance with the present invention.

A slice or wafer of P-type silicon of uniform resistivity having flat, planar, parallel, opposed major surfaces, a fragment 10 of which is shown in FIG. 1, is produced by any of the known techniques of crystal fabrication including appropriate slicing and cleaning operations. A pattern of N+ type regions 11 are formed in the surface of the wafer as by conventional diffusion techniques in order to diffuse N-type conductivity imparting material only into the portions desired, known techniques of diffusing through openings in an adherent protective coating are employed.

In accordance with one known technique an adherent nonconductive protective coating of silicon oxide is formed on the surface of the silicon wafer. The oxide coating is covered with a photoresist solution and the photoresist is exposed to ultraviolet light through a mask shielding the areas through which the conductivity type imparting material is to be diffused. The photoresist in these areas is thus not exposed to the light, and after the exposed portions are developed the unexposed resist on these areas is easily washed off while the exposed areas remain. The oxide coating unprotected by the resist is removed in an etching solution which does not attack the resist, thereby forming openings of the desired configuration in the oxide coating. The previously exposed photoresist is then dissolved to leave only the oxide coating with the openings of the desired configuration on the surface of the silicon wafer. The wafer is treated in a diffusion furnace to diffuse an N-type conductivity type imparting material through the openings in the oxide coating into the regions 11 of the P-type substrate 10.

Figure 2:
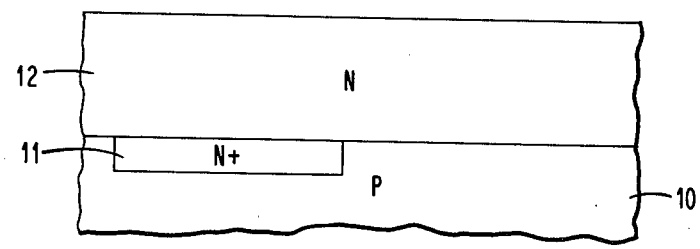

Next, as illustrated in FIG. 2 an epitaxial layer 12 of N-type silicon of uniform moderate resistivity is grown on the surface of the substrate as by known vapor decomposition techniques. A gaseous compound of silicon mixed with a controlled quantity of a gaseous compound of an N-type conductivity imparting material is reacted with a gas at the surface of the slice to cause deposition of silicon doped with the conductivity type imparting material. A layer 12 which is precisely controlled as to thickness and as to resistivity and which is a continuation of the crystalline structure of the single crystal substrate 10 is thus deposited on the surface of the substrate. The upper surface of the epitaxial layer 12 is parallel to the interface between the substrate and the layer.

Figure 3:
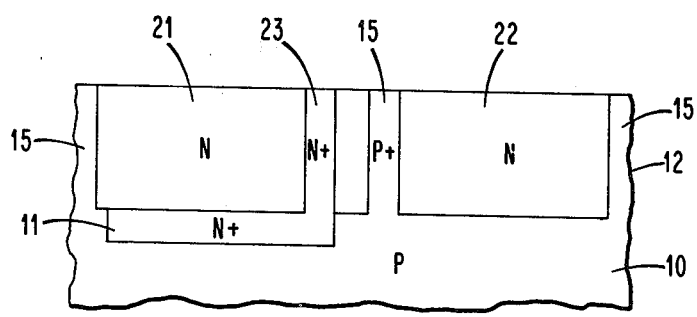

As illustrated in FIG. 3 the wafer is treated in accordance with conventional techniques to diffuse or implant P-type conductivity imparting material into selected portions of the epitaxial layer. The P-type conductivity imparting material is diffused from the surface to the underlying substrate of P-type material, thus forming isolation barriers 15 in the fragment 10. The pattern of the P+ type isolation barriers 15 forms a first sector 21 of N-type conductivity in a first section of the wafer and a second sector 22 of N-type conductivity in a second section of the wafer. The first and second sectors 21 and 22 are of the same resistivity as the original N-type material of the N-type epitaxial layer. The sectors are encircled by the P+ type isolation barriers 15 electrically isolating the two sectors from the remainder of the wafer and electrically separating them from each other. Next, as also shown in FIG. 3 high concentrations of N-type conductivity imparting material are diffused or implanted into the wafer to provide a low resistivity contact 23 to the underlying buried region 11. The contact region 23 extends from the surface to the underlying buried region 11 to provide continuous N+ type material from the surface to beneath the N-type sector 21 of moderate resistivity.

Figure 4:
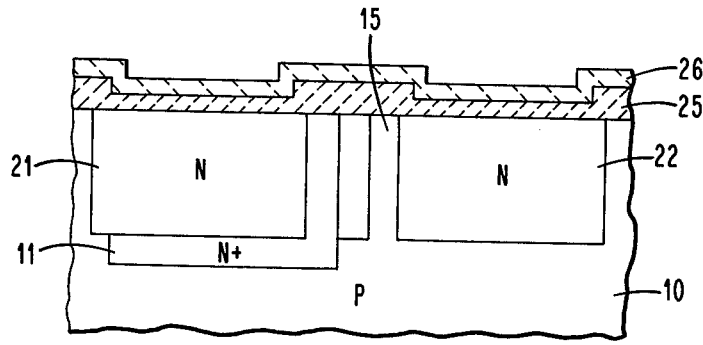

Next a coating of silicon oxide is grown on the surface of the wafer. Portions of the silicon oxide coating are removed by conventional masking and etching procedures to expose a part of the first sector 21 and a part of the second sector 22. Then, additional silicon oxide is grown to provide a layer of silicon oxide 25 as illustrated in FIG. 4 which is thinner over the parts of the first and second sectors 21 and 22 and thicker over the remainder of the sectors and the contiguous isolating barriers 15 of both sections of the fragment. A uniform layer of silicon nitride 26 is then deposited over the layer of silicon oxide 25 as illustrated in FIG. 4.

Figure 5:
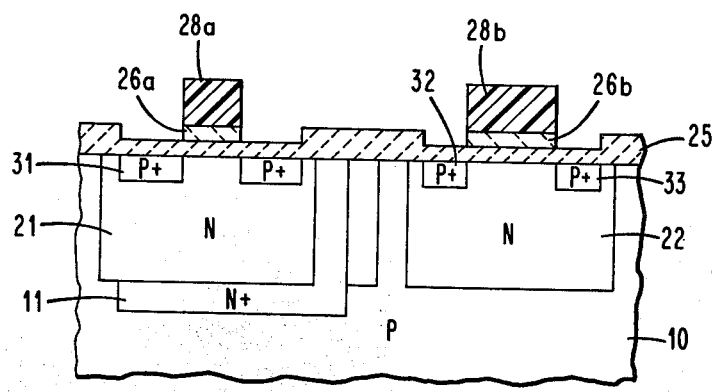

The silicon nitride layer 26 is then etched by conventional photoresist masking and etching techniques to leave a layer 26a of silicon nitride over a predetermined zone of the first sector 21 and another layer 26b over a predetermined zone of the second sector 22. As illustrated in FIG. 5 portions of the photoresist layer 28a and 28b delineating the layers of silicon nitride 26a and 26b, respectively, are left in place. As will be apparent from the discussion hereinbelow the zone of the first sector 21 underlying the layer 26a of silicon nitride delineates the dimensions of the active emitter and base regions of the bipolar transistor being fabricated in the first section, and the configuration of the other silicon nitride layer 26b delineates the dimensions of the high value resistor element being fabricated in the second section.

The wafer is then treated in conventional ion implantation apparatus to implant P-type conductivity imparting material into regions of the first and second sectors 21 and 22 which are not protected by the combination of the silicon nitride layers 26a and 26b together with the photoresist layers 28a and 28b or the thicker portions of the silicon oxide layer 25. The ion implanted P-type conductivity imparting material is implanted into the silicon material through the thinner portion of the silicon oxide layer 25 while the thicker portion and the combination of silicon nitride and photoresist mask the conductivity type imparting material from reaching the underlying surface of the wafer. In the first sector 21 the region 31 of P-type conductivity formed encircles the zone underlying the silicon nitride layer 26a. In the second sector 22 two separate spaced apart regions 32 and 33 are formed. All the regions are of relatively low resistivity. As will be apparent from the discussion hereinbelow the region 31 provides a contact region to the active base region of the transistor and the regions 32 and 33 provide low resistance contact regions to the active region of the resistor being fabricated.

Figure 6:
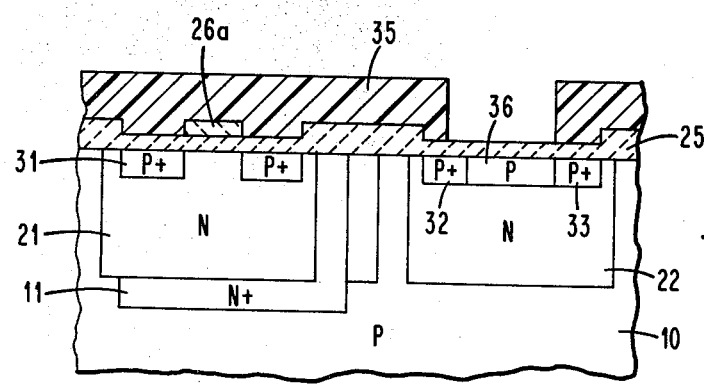

The photoresist 28a and 28b is removed and replaced using conventional techniques to form a photoresist layer 35 as shown in FIG. 6. The photoresist layer 35 has an opening which exposes the second layer 26b of silicon nitride (which was shown in FIG. 5) and the layer of silicon oxide 25 overlying portions of the resistor contact regions 32 and 33. The silicon nitride layer 26b is then removed as by etching in a suitable etching material which does not attack the photoresist material or the silicon oxide. P-type conductivity imparting material is then implanted into the portion of the second sector 22 underlying the opening in the photoresist layer 35. The conductivity type imparting material penetrates the layer of silicon oxide 25 which is relatively thin at the opening but does not penetrate the photoresist 35 which remains after the silicon nitride has been removed. The P-type conductivity imparting material produces a relatively high resistivity region 36 extending between the two low resistivity contact regions 32 and 33. Although P-type conductivity imparting material is also implanted into portions of the contact regions 32 and 33 in order to insure that the region 36 is contiguous the contact regions, the additional material in the overlapping portions has no significant effect on the resistive value of the resistor produced. By virtue of the ion implantation of the conductivity type imparting material into the resistor region 36 being done separately from the introduction of conductivity type imparting materials into active regions of the transistor, the resistivity of the region may be accurately controlled in accordance with the desired value of the resistor to be obtained. The photoresist layer 35 is removed, and the wafer is heat treated in known fashion to redistribute the conductivity type imparting material diffusing it farther into the wafer of silicon.

Figure 7:
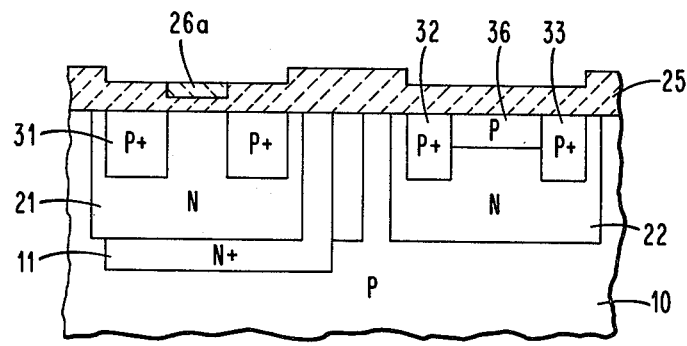
Figure 8:
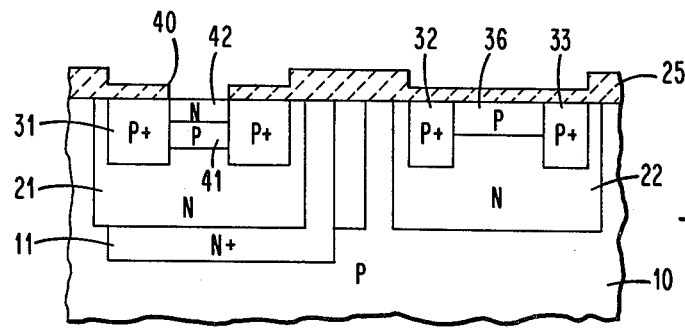

Next, the thickness of the oxide layer 25 is increased by exposing the wafer to oxygen at an elevated temperature in order to convert silicon at the surface to silicon oxide. The layer of silicon nitride 26a prevents oxidation of the underlying silicon. Thus, all of the oxide layer 25 other than that protected by the silicon nitride 26a increases in thickness leaving a thinner region underlying the silicon nitride layer 26a. FIG. 7 illustrates the fragment 10 of the wafer at this stage. The wafer is then etched in a material which removes the silicon nitride 26a while having no significant effect on the silicon oxide layer 25. Then the silicon oxide is reduced in thickness by treating the wafer in a suitable etching solution. The etching is maintained for a period of time sufficient to remove the thin portion of the oxide layer 25 formerly underlying the silicon nitride layer 26a. Thus, as shown in FIG. 8, an opening 40 is produced in the silicon oxide layer 25 overlying the zone within the first sector 21 delineated by the silicon nitride layer 26a.

The wafer is then subjected to ion implantation by N-type conductivity imparting material. The silicon oxide layer 25 protects the wafer except for the zone exposed at the opening 40. Subsequent to the ion implantation of the N-type conductivity imparting material, P-type conductivity imparting material is implanted at the surface exposed by the opening 40. The ion implanting procedures are controlled so as to form a P-type region 41 in a first portion of the zone and an N-type region 42 in a second portion of the zone lying between the surface and the first portion 41. The procedures of ion implantation of the N-type and P-type conductivity imparting materials permit very precise control to obtain the desired resistivity profile of the two regions 41 and 42. If appropriate to established desired characteristics, the P-type conductivity imparting material may be implanted first followed by the N-type conductivity imparting material. Subsequent to the ion implantation process, the wafer is annealed so as to properly activate the conductivity type imparting materials in the regions 41 and 42. The P-type and N-type regions 41 and 42 thus formed provide the active base and active emitter regions, respectively, for the bipolar transistor fabricated in the first section of the wafer.

Figure 9:
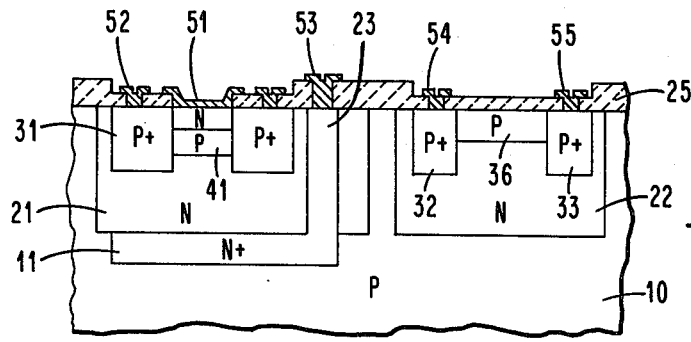
Figure 9A:
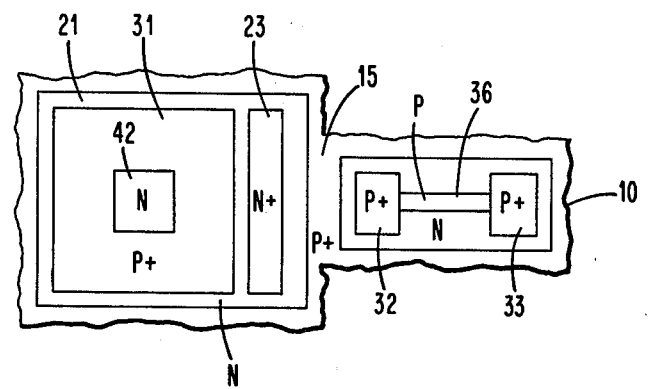
FIG. 9A is a plan view of the fragment of the wafer as shown in FIG. 9 without the protective material and metal contacts.

Additional openings are then formed in the silicon oxide layer 25 as illustrated in FIG. 9 to permit conductive electrical contacts to be made to the regions of the bipolar transistor and to the opposite ends of the resistor. FIG. 9A is a plan view illustrating the surface of the fragment of the wafer without adherent material. The electrical contacts are formed by known techniques as by sputtering on aluminum and then suitably masking and etching and heat treating to leave conductive members in the desired pattern making ohmic contact at the exposed silicon surfaces. A contact 51 to the surface of the emitter region 42 is of exactly the same configuration as the opening 40 which defined the active emitter and base regions. A contact 52 to the base contact region 31 provides an electrical connection to the base region 41. Connection to the active collector region of the first sector 21 adjacent to the active base region is provided by a contact 53 to the N+ type contact region 23 which is contiguous the N+ type buried region 11. Ohmic contacts 54 and 55 to the P+ type contact regions 32 and 33 provide electrical connection to the opposite ends of the resistor region 36.

In the fabrication of an exemplary integrated circuit structure in accordance with the invention the substrate 10 may be a slice of single crystal P-type silicon lightly doped with boron to produce a uniform resistivity of approximately 7 to 14 ohm-centimeters. The first N-type diffusion to form the N+ type buried region 11 employs arsenic as the conductivity type imparting material. The N-type epitaxial layer 12 of silicon is doped with arsenic during deposition to provide a uniform moderate resistivity of about 1.5 ohm-centimeters. The N-type layer 12 may be about 4 micrometers thick.

The P+ type diffusion to form the isolation barriers 15 employs boron as the conductivity type imparting material. The contact region 23 of N+ type material is formed by diffusing phosphorous through the epitaxial layer to the underlying buried region 11.

The first coating of the silicon oxide layer 25 is about 1 micrometer thick, and the second coating is about 500 angstroms thick. The silicon nitride layer 26 is about 1,000 angstroms thick. The P+ type contact regions 31, 32, and 33 are formed by implanting boron. These region have a sheet resistivity of about 100 ohms per square. Boron is also implanted in the P-type resistor region 36 to produce upon subsequent heat treatment sheet resistivities within the range of from 1,000 to 2,000 ohms per square as desired.

After the P-type resistor region 36 is formed, the thickness of the silicon oxide layer 25 is increased by about 4,000 angstroms in the unprotected thinner portion, as shown in FIG. 7. Arsenic is implanted through the opening 40 to form the emitter region 42 and boron is implanted to form the active base region 41. Typically, the sheet resistivity of the base region 41 after annealing is 5,000 to 10,000 ohms per square and that of the emitter region is about 20 ohms per square.

The process as described employs techniques which are compatible with the fabrication of high frequency, low noise bipolar transistors and the fabrication of resistors having characteristics independently of the transistor characteristics in a monolithic integrated circuit structure. The self-aligned emitter process employing ion implantation techniques for forming the active emitter and base regions permits precise control of the characteristics of these regions. The formation of resistors by ion implantation separate from the formation of the base region permits the fabrication of precise high value resistors utilizing less wafer surface area and having reduced parasitic capacitance.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating monolithic integrated circuit structure incorporating a bipolar transistor and a resistor comprising:

providing a body of semiconductor material including a first section having semiconductor material of one conductivity type encircling a first sector of the opposite conductivity type inset at a surface of the body and a second section having semiconductor material of the one conductivity type encircling a second sector of the opposite conductivity type inset at the surface of the body;

forming an adherent layer of a first protective material on said surface, the portion of said layer overlying a predetermined part of said first sector being thinner than the portion of said layer overlying the remainder of said first section, and the portion of said layer overlying a predetermined part of said second sector being thinner than the portion of said layer overlying the remainder of said second section;

forming an adherent layer of a second protective material on the thinner portion of said layer of the first protective material overlying a predetermined zone within said part of said first sector, and forming a adherent layer of the second protective material on the thinner portion of said layer of the first protective material overlying a predetermined zone within said part of said second sector;

introducing conductivity type imparting material of the one conductivity type into said part of said first sector other than said predetermined zone protected by said second protective material, the thicker portion of the layer of the first protective material protecting the remainder of the first section, to form a region of the one conductivity type of low resistivity within said first sector; and simultaneously introducing conductivity type imparting material of the one conductivity type into said part of said second sector other than said predetermined zone protected by said second protective material, the thicker portion of the layer of first protective material protecting the remainder of the second section, to form first and second regions of the one conductivity type of low resistivity within said second sector;

removing the layer of the second protective material overlying said predetermined zone of said part of said second sector;

introducing conductivity type imparting material of the one conductivity type into the predetermined zone of said part of said second sector to form a region of the one conductivity type of high resistivity extending between said first and second regions of the one conductivity type of low resistivity;

increasing the thickness of the layer of the first protective material except for the portion thereof underlying the layer of the second protective material which overlies said predetermined zone of said part of said first sector by treating the body of semiconductor material in the presence of a material to convert semiconductor material underlying the first protective material to first protective material of the layer, said second protective material preventing conversion of the underlying semiconductor material of said predetermined zone of said part of said first sector;

removing the layer of the second protective material overlying said predetermined zone of said part of said first sector;

reducing the thickness of the layer of the first protective material sufficiently to form an opening in the layer of the first protective material exposing the surface of said predetermined zone while leaving a layer of the first protective material overlying the remainder of said first section and said second section; and introducing conductivity type imparting material of the one conductivity type into a first portion and conductivity type imparting material of the opposite conductivity type into a second portion of said predetermined zone as delineated by said opening, said second portion being located between said first portion and said surface whereby said second portion of said predetermined zone provides the active emitter region, said first portion of said predetermined zone provides the active base region, the portion of said first sector of the opposite conductivity type adjacent to said first portion of said predetermined zone provides the active collector region, and said region of the one conductivity type of low resistivity provides a base contact region of a bipolar transistor in said first section; and said region of the one conductivity type of high resistivity provides a resistor, and said first and second regions of the one conductivity type of low resistivity provide resistor contact regions of a resistor within said second section.

2. The method of fabricating monolithic integrated circuit structure in accordance with claim 1 wherein introducing conductivity type imparting material of the one conductivity type into the predetermined zone of said part of said second sector to form a region of the one conductivity type of high resistivity includes ion implanting conductivity type imparting material of the one conductivity type through the thinner portion of the layer of the first protective material overlying said predetermined zone.

3. The method of fabricating monolithic integrated circuit structure in accordance with claim 2 wherein introducing conductivity type imparting material of the one conductivity type into a first portion of said predetermined zone of said first sector includes ion implanting conductivity type imparting material of the one conductivity type through said opening into said first portion of said predetermined zone of said first sector; and introducing conductivity type imparting material of the opposite conductivity type into a second portion of said predetermined zone of said first sector includes ion implanting conductivity type imparting material of the opposite conductivity type through said opening into said first portion of said predetermined zone of said first sector.

4. The method of fabricating monolithic integrated circuit structure in accordance with claim 3 wherein the semiconductor material is silicon;

said first protective material is silicon oxide; and said second protective material is silicon nitride.

5. The method of fabricating monolithic integrated circuit structure in accordance with claim 4 wherein increasing the thickness of the layer of the first protective material includes exposing the body of silicon to oxygen at an elevated temperature to grow silicon oxide at said surface except at the surface area underlying the layer of the second protective material.

6. The method of fabricating monolithic integrated circuit structure incorporating a bipolar transistor and a resistor comprising:

providing a substrate of semiconductor material of one conductivity type having a flat planar surface;

growing an epitaxial layer of semiconductor material of the opposite conductivity type on said surface of the substrate, said layer having a flat planar surface parallel to the interface of the layer and the substrate, said substrate and said layer forming a body of semiconductor material;

introducing conductivity type imparting material of the one conductivity type into selected portions of said epitaxial layer from the surface to said substrate to form isolating barriers of semiconductor material of the one conductivity type delineating a first sector of the opposite conductivity type electrically isolated from the remainder of the body and delineating a second sector of the opposite conductivity type electrically isolated from the remainder of the body;

forming an adherent layer of a first protective material on said surface of said body, the portion of said layer overlying a predetermined part of said first sector being thinner than the portion of said layer overlying the remainder of said first sector and the isolating barriers contiguous said first sector, and the portion of said layer overlying a predetermined part of said second sector being thinner than the portion of said layer overlying the remainder of said second sector and the isolating barriers contiguous said second sector;

forming an adherent layer of a second protective material on said layer of the first protective material;

removing said layer of the second protective material overlying said first sector and the isolating barriers contiguous said first sector except for a portion adherent to the thinner portion of the layer of the first protective material overlying a predetermined zone within said part of said first sector, and simultaneously removing said layer of the second protective material overlying said second sector and the isolating barriers contiguous said second sector except for a portion adherent to the thinner portion of the layer of the first protective material overlying a predetermined zone within said part of said second sector;

introducing conductivity type imparting material of the one conductivity type into said part of said first sector other than said predetermined zone protected by said second protective material, the thicker portion of the layer of the first protective material protecting the remainder of the first sector, to form a region of the one conductivity type of low resistivity inset within said first sector; and simultaneously introducing conductivity type imparting material of the one conductivity type into said part of said second sector other than said predetermined zone protected by said second protective material, the thicker portion of the layer of the first protective material protecting the remainder of the second sector to form first and second regions of the one conductivity type of low resistivity inset within said second sector;

removing the portion of the layer of the second protective material overlying said predetermined zone of said part of said second sector;

placing a coating of protective material overlying said first and second sectors and the isolating barriers contiguous thereto and having an opening exposing the portion of said layer of the first protective material overlying said predetermined zone and the adjacent portions of said first and second regions of the one conductivity type of low resistivity inset within said second sector;

introducing conductivity type imparting material of the one conductivity type into the portion of said second sector underlying said opening in the coating to form a region of the one conductivity type of high resistivity extending between said first and second regions of the one conductivity type of low resistivity;

removing said coating of protective material;

increasing the thickness of the layer of the first protective material except for the portion thereof underlying the layer of the second protective material which overlies said predetermined zone of said part of said first sector by treating the body of semiconductor material in the presence of a material to convert semiconductor material underlying the first protective material to first protective material of the layer, said second protective material preventing conversion of the underlying semiconductor material of said predetermined zone of said part of said first sector;

removing the layer of the second protective material overlying said predetermined zone of said part of said first sector;

reducing the thickness of the layer of the first protective material sufficiently to form an opening in the layer of the first protective material exposing the surface of said predetermined zone of said first sector while leaving a layer of the first protective material overlying the remainder of said first sector and said second sector and the isolating barriers contiguous thereto; and introducing conductivity type imparting material of the one conductivity type through said opening into a first portion of said predetermined zone of said first sector and conductivity type imparting material of the opposite conductivity type through said opening into a second portion of said predetermined zone of said first sector, said second portion being located between said first portion and said surface;

whereby said second portion of said predetermined zone provides the active emitter region, said first portion of said predetermined zone provides the active base region, the portion of said first sector of the opposite conductivity type adjacent to said first portion of said predetermined zone provides the active collector region, and said region of the one conductivity type of low resistivity provides a base contact region of a bipolar transistor in said first sector; and said region of the one conductivity type of high resistivity provides a resistor, and said first and second regions of the one conductivity type of low resistivity provide resistor contact regions of a resistor within said second sector.

7. The method of fabricating monolithic integrated circuit structure in accordance with claim 6 wherein
introducing conductivity type imparting material of the one conductivity type into the portion of the second sector underlying said opening in the coating to form a region of the one conductivity type of high resistivity includes ion implanting conductivity type imparting material of the one conductivity type through the thinner portion of the layer of the first protective material exposed at said opening.

8. The method of fabricating monolithic integrated circuit structure in accordance with claim 7 wherein
introducing conductivity type imparting material of the one conductivity type through said opening into a first portion of said predetermined zone of said first section includes ion implanting conductivity type imparting material of the one conductivity type through said opening into said first portion of said predetermined zone of said first sector; and
introducing conductivity type imparting material of the opposite conductivity type through said opening into a second portion of said predetermined zone of said first sector includes ion implanting conductivity type imparting material of the opposite conductivity type through said opening into said second portion of said predetermined zone of said first sector.

9. The method of fabricating monolithic integrated circuit structure in accordance with claim 8 wherein
introducing conductivity type imparting material of the one conductivity type into said part of said first sector other than said predetermined zone to form a region of the one conductivity type of low resistivity inset within said first sector and simultaneously introducing conductivity type imparting material of the one conductivity type into said part of said second sector other than said predetermined zone to form first and second regions of the one conductivity of lower resistivity inset within said second sector includes ion implanting conductivity type imparting material of the one conductivity type through the exposed thinner portions of the first protective material.

10. The method of fabricating monolithic integrated circuit structure in accordance with claim 9 wherein
said region of the one conductivity type of low resistivity inset within said first sector completely encircles and is contiguous said predetermined zone of said first sector at said surface of the body; and
said first portion and said second portion of said predetermined zone of said first sector are encircled by and contiguous said region of the one conductivity type of low resistivity.

11. The method of fabricating monolithic integrated circuit structure in accordance with claim 10 including
prior to growing the epitaxial layer, forming in the substrate of semiconductor material a buried region of the opposite conductivity type of low resistivity for underlying the subsequently formed collector region of said first sector; and
subsequent to introducing conductivity type imparting material of the one conductivity type to form isolating barriers, introducing conductivity type imparting material of the opposite conductivity type into a selected portion of the epitaxial layer from the surface of the body to said buried region of the opposite conductivity type of low resistivity to form a contact region of the opposite conductivity type of low resistivity extending from the surface to said buried region.

12. The method of fabricating monolithic integrated circuit structure in accordance with claim 11 wherein
forming an adherent layer of a first protective material on said surface of the body includes
forming a first coating of the first protective material of uniform thickness on said surface of the body,
removing the portion of said first coating overlying said predetermined part of said first sector, and
forming a second coating of the first protective material overlying said first coating and the exposed surface over said predetermined part of said first sector.

13. The method of fabricating monolithic integrated circuit structure in accordance with claim 11 wherein
the semiconductor material is silicon;
said first protective material is silicon oxide; and
said second protective material is silicon nitride.

14. The method of fabricating monolithic integrated circuit structure in accordance with claim 13 wherein
increasing the thickness of the layer of the first protective material includes exposing the body of silicon to oxygen at an elevated temperature to grow silicon oxide at said surface except at the surface area underlying the layer of the second protective material.

15. The method of fabricating monolithic integrated circuit structure in accordance with claim 14 including
subsequent to introducing conductivity type imparting material of the opposite conductivity type into said second portion of said predetermined zone of said first sector, forming openings in the layer of the first protective material to expose a portion of the surface of said region of the one conductivity type of low resistivity inset within said first sector, a portion of the surface of said contact region of the opposite conductivity type of low resistivity in said first sector, and portions of the surfaces of said first and second regions of the one conductivity type of low resistivity in said second sector; and
applying conductive material to said body to form a first electrical connection in ohmic contact with the exposed surface of said second portion of said predetermined zone of said first sector, a second electrical connection in ohmic contact with the exposed surface of said region of the one conductivity type of low resistivity inset within said first sector, a third electrical connection in ohmic contact with the exposed surface of said contact region of the opposite conductivity type of low resistivity in said first sector, and fourth and fifth electrical connections in ohmic contact with the exposed surfaces of said first and second regions of the one conductivity type of low resistivity in said second sector, respectively.

16. The method of fabricating monolithic integrated circuit structure in accordance with claim 15 wherein the one conductivity type is P-type; and the opposite conductivity type is N-type.

* * * * *